(12) United States Patent
Ravinuthula et al.

(10) Patent No.: US 9,543,969 B2
(45) Date of Patent: Jan. 10, 2017

(54) HIGH-SPEED RESISTOR-BASED CHARGE PUMP FOR ACTIVE LOOP FILTER-BASED PHASE-LOCKED LOOPS

(71) Applicant: Texas Instruments Incorporated, Dallas, TX (US)

(72) Inventors: Vishnu Ravinuthula, Allen, TX (US); Kenneth George Maclean, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/961,590

(22) Filed: Dec. 7, 2015

(65) Prior Publication Data

US 2016/0164405 A1   Jun. 9, 2016

Related U.S. Application Data

(60) Provisional application No. 62/088,322, filed on Dec. 5, 2014.

(51) Int. Cl.
*H03L 7/06*    (2006.01)
*H03L 7/085*   (2006.01)

(52) U.S. Cl.
CPC .................... *H03L 7/085* (2013.01)

(58) Field of Classification Search
USPC .................. 327/147–149, 156–158
See application file for complete search history.

(56) References Cited

U.S. PATENT DOCUMENTS

| | | | | |
|---|---|---|---|---|
| 6,229,361 B1* | 5/2001 | Henwood | ............. | H03L 7/0898 327/113 |
| 7,514,985 B2* | 4/2009 | Chang | ................... | H03L 7/0896 327/157 |
| 2005/0218948 A1* | 10/2005 | Zhu | ........................ | H03L 7/0896 327/157 |
| 2007/0018701 A1* | 1/2007 | Abbasi | .................... | H02M 3/07 327/157 |
| 2012/0235719 A1* | 9/2012 | Huang | ....................... | H03L 7/10 327/157 |
| 2016/0164405 A1* | 6/2016 | Ravinuthula | .......... | H03L 7/085 327/157 |

* cited by examiner

*Primary Examiner* — Adam Houston
(74) *Attorney, Agent, or Firm* — Gregory J. Albin; Charles A. Brill; Frank D. Cimino

(57) ABSTRACT

Techniques are described for increasing the speed of a resistor-based charge pump for an active loop filter-based phase-locked loop (PLL). The techniques may include placing a low-resistance discharge path between respective nodes of a current source and sink in a charge pump, and selectively activating the low-resistance discharge path when the charge pump is turned off. The low-resistance discharge path may have a resistance that is lower than the resistance of other current paths between the respective nodes in the charge pump (e.g., current paths formed by the resistors included in the current source and sink of the charge pump), thereby reducing the amount of time needed to reset the charge on the respective nodes when the charge pump is turned off. In this way, the speed of a resistor-based charge pump may be increased, thereby allowing the overall speed of an active filter-based PLL to be increased.

20 Claims, 4 Drawing Sheets

HIGH-SPEED RESISTOR-BASED CHARGE PUMP FOR ACTIVE LOOP FILTER-BASED PHASE-LOCKED LOOPS

This application claims the benefit of U.S. Provisional Application No. 62/088,322, filed Dec. 5, 2014, the entire content of which is incorporated herein by reference.

TECHNICAL FIELD

The disclosure relates to electrical circuits, and more particularly, to charge pump-based phase-locked loop (PLL) circuits.

BACKGROUND

Phase-locked loops (PLLs) may be used in a variety of different systems including communication and multimedia systems. PLLs may be used for frequency synthesis, deskewing, clock generation, clock distribution, clock recovery, and other signal processing, timing and/or synchronization purposes.

A PLL may operate as a feedback control system that generates an output signal based on an input signal such that a substantially constant phase delay is maintained between the input and output signals for a given frequency. Designing PLL control loops that can operate at high-speeds may present significant design challenges, particularly in low-voltage applications.

SUMMARY

According to this disclosure, an integrated circuit includes a phase-frequency detector (PFD) having a first output and a second output. The integrated circuit further includes a current source having a control terminal coupled to the first output of the PFD, and an output terminal. The integrated circuit further includes a current sink having a control terminal coupled to the second output of the PFD, and an output terminal coupled to the output terminal of the current source. The integrated circuit further includes a switch having a first conduction electrode coupled to a first node in the current source, a second conduction electrode coupled to a second node in the current sink, and a control electrode. The integrated circuit further includes a control circuit having a first input coupled to the first output of the PFD, a second input coupled to the second output of the PFD, and an output coupled to the control electrode of the switch.

According to this disclosure, an integrated circuit includes a charge pump. The charge pump includes an output terminal. The charge pump further includes a current source including one or more resistors coupled between a first node and the output terminal. The charge pump further includes a current sink including one or more resistors coupled between a second node and the output terminal. The charge pump further includes a switch including a first terminal coupled to the first node of the current source and a second terminal coupled to the second node of the current sink.

According to additional aspects of this disclosure, a method includes selectively closing a switch that connects a first node in a current source of a charge pump to a second node in a current sink of the charge pump based on whether both outputs of a phase-frequency detector (PFD) indicate that a charge pump is to be deactivated.

DETAILED DESCRIPTION

Figure 1:
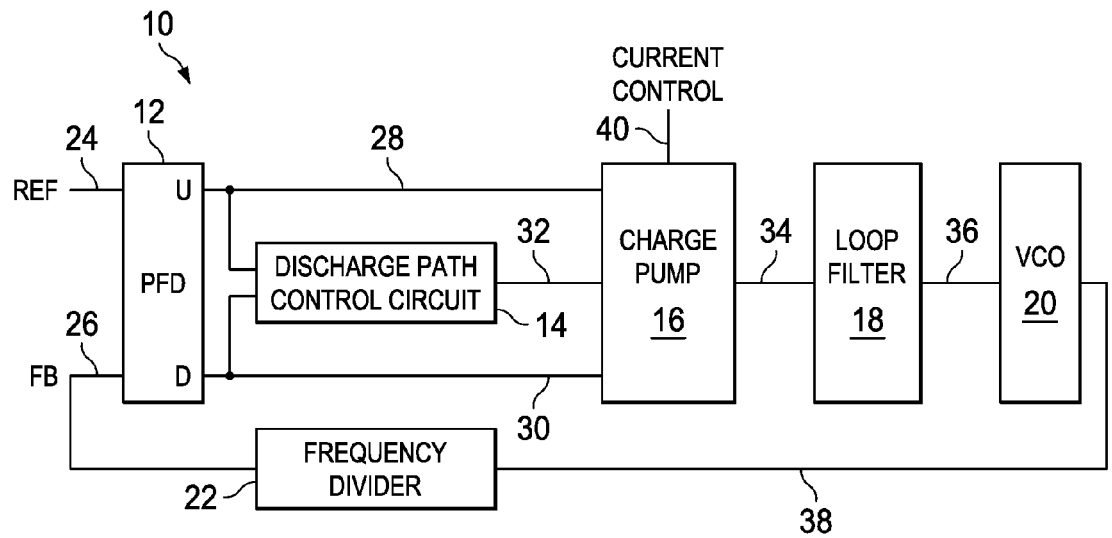
FIG. 1 is a block diagram of showing an example phase-locked loop (PLL) that may use a high-speed charge pump and a discharge path control circuit according to this disclosure.

This disclosure describes techniques for increasing the speed of a resistor-based charge pump for an active loop filter-based phase-locked loop (PLL). The techniques may include placing a low-resistance discharge path between respective nodes of a current source and sink in the charge pump, and selectively activating the low-resistance discharge path when the charge pump is turned off. The low-resistance discharge path may have a resistance that is lower than the resistance of other current paths between the respective nodes in the charge pump (e.g., current paths formed by the resistors included in the current source and sink of the charge pump), thereby reducing the amount of time needed to reset the charge on the respective nodes when the charge pump is turned off. In this way, the speed of operation of a resistor-based charge pump may be increased, thereby allowing the overall speed of an active filter-based PLL to be increased.

An active loop filter-based PLL may use a phase-frequency detector (PFD), a resistor-based charge pump, and an active filter to adjust the control voltage of a voltage-controlled oscillator in order to maintain a constant phase relationship between the input and output signals of the PLL. The operation amplifier (op-amp) of the active filter may regulate the output of the charge pump at a reference voltage that is between a high supply voltage and a low supply voltage (e.g., a ground potential).

The charge pump may include a current source and a current sink that each include one or more resistors which determine the level of current produced by the respective source or sink. Prior to turning on the charge pump, a first node in a current source and a second node in the current sink may be initially charged to the reference voltage provided by the active filter.

When both the current source and current sink of the charge pump are turned on, the first node in the current source may be charged to a high supply voltage, and the second node in the current sink may be discharged to a low supply voltage (e.g., a ground potential). When the charge pump is turned off, the resistors in the current source and sink may form a discharge path between the first and second nodes. The discharge path may allow the voltage at the first and second nodes to return to the regulated voltage provided by the active filter. The parasitic capacitance of the nodes and the resistances included in the discharge path may significantly delay the amount of time for the first and second nodes to return to the regulated voltage, thereby decreasing the maximum speed at which the charge pump may operate.

According to this disclosure, a low-resistance discharge path may be coupled between a first node in the current source of the charge pump and a second node in the current sink of the charge pump. The low-resistance discharge path may have a resistance that is lower than the resistance of the current path formed by the resistors in the current source and sink of the charge pump. The relatively low resistance may allow the first and second nodes to return to the regulated voltage in a shorter amount of time than would otherwise occur without the low-resistance discharge path. In this way, the speed of a resistor-based charge pump may be increased, thereby allowing the overall speed of an active filter-based PLL to be increased.

FIG. 1 is a block diagram of showing an example phase-locked loop (PLL) 10 according to this disclosure. PLL 10 includes a phase-frequency detector (PFD) 12, a discharge path control circuit 14, a charge pump 16, a loop filter 18, a voltage controlled oscillator (VCO) 20, a frequency divider 22, and leads 24, 26, 28, 30, 32, 34, 36, 38, 40. Any combination of the components in FIG. 1 may be implemented entirely or partially on one or more integrated circuits.

PFD 12 has a reference input coupled to a reference lead 24, and a feedback input coupled to a feedback lead 26. PFD 12 further includes an UP output (U) coupled to a current source control input of charge pump 16 and to a first input of discharge path control circuit 14 via UP lead 28. PFD 12 further includes a DOWN output (D) coupled to a current sink control input of charge pump 16 and to a second input of discharge path control circuit 14 via DOWN lead 30. An output of discharge path control circuit 14 is coupled to a discharge path control input of charge pump 16 via lead 32.

Charge pump 16 includes one or more current amplitude control inputs coupled to leads 40. Leads 40 may be coupled to one or more current amplitude control signal sources. An output of charge pump 16 is coupled to loop filter 18 via lead 34. An output of loop filter 18 is coupled to VCO 20 via lead 36. An output of VCO 20 is coupled to frequency divider 22 via lead 38. An output of frequency divider 22 is coupled to the feedback input of PFD 12 via feedback lead 26.

In some examples, instead of including a frequency divider 22 as shown in the example PLL 10 of FIG. 1, the output of VCO 20 may be directly coupled to the feedback input of PFD 12 via one or more leads.

PFD 12 is configured to receive a reference signal (or reference clock) (REF) via reference lead 24, and a feedback signal (or feedback clock) (FB) via feedback lead 26. PFD 12 is further configured to generate and output the UP and DOWN signals via the UP and DOWN outputs, respectively, based on the reference signal and the feedback signal.

PFD 12 may start in an initial state where both the UP and DOWN signals are deactivated (e.g., both the UP and DOWN signals are equal to a low voltage state). While in the initial state, PFD 12 may wait to receive a rising edge of one of the reference and feedback signals. In response to receiving a rising edge of the reference signal prior to a rising edge of the feedback signal, PFD 12 may activate the UP signal (e.g., transition the UP signal to a high voltage state). After activating the UP signal, PFD 12 may wait to receive a rising edge from the feedback signal. In response to receiving the rising edge of the feedback signal, PFD 12 may deactivate both of the UP and DOWN signals. In some cases, to deactivate both of the UP and DOWN signals, PFD 12 may briefly activate the DOWN signal such that both of the UP and DOWN signals are momentarily activated. In response to both of the UP and DOWN signals being activated, internal circuitry of PFD 12 may deactivate both of the UP and DOWN signals.

In response to receiving a rising edge of the feedback signal prior to a rising edge of the reference signal, PFD 12 may activate the DOWN signal (e.g., transition the DOWN signal to a high voltage state). After activating the DOWN signal, PFD 12 may wait to receive a rising edge from the reference signal. In response to receiving the rising edge of the reference signal, PFD 12 may deactivate both of the UP and DOWN signals. In some cases, to deactivate both of the UP and DOWN signals, PFD 12 may briefly activate the UP signal such that both of the UP and DOWN signals are momentarily activated. In response to both of the UP and DOWN signals being activated, internal circuitry of PFD 12 may deactivate both of the UP and DOWN signals.

The example PFD 12 described above uses rising edge detection and active high outputs. In other example PLLs, PFD 12 may include falling edge detection and/or one or more active low outputs.

If the frequencies of the reference and feedback signals are approximately equal, then PFD 12 may generate the UP and DOWN signals such that the average values (or pulse widths) of the signals are indicative of a phase difference between the reference and feedback signals. For example, if the reference signal leads the feedback signal, PFD 12 may generate the UP signal such that the average value (or pulse width) of the UP signal is indicative of (or proportional to) the phase difference between the reference and feedback signals (e.g., the amount by which the reference signal leads the feedback signal). On the other hand, if the feedback signal leads the reference signal, PFD 12 may generate the DOWN signal such that the average value (or pulse width) of the DOWN signal is indicative of (or proportional to) the phase difference between the reference and feedback signals (e.g., the amount by which the feedback signal leads the reference signal). In some examples, the average value of the difference between the UP and DOWN signals may be indicative of (or proportional to) a phase difference between the reference and feedback signals.

If the frequencies of the reference and feedback signals are not equal, then PFD 12 may generate the UP and DOWN signals such that the UP and DOWN signals (or the average values of the UP and DOWN signals) are indicative of a frequency difference between the reference and feedback signals. For example, PFD 12 may activate the UP signal for a greater amount of time, on average, than the DOWN signal to indicate that the frequency of the reference signal is greater than the frequency of the feedback signal. On the other hand, PFD 12 may activate the DOWN signal for a greater amount of time, on average, than the UP signal to indicate that the frequency of the feedback signal is greater than the frequency of the reference signal. In some examples, the average value of the difference between the UP and DOWN signals may be indicative of (or proportional to) a frequency difference between the reference and feedback signals.

Discharge path control circuit 14 is configured to receive the UP signal via UP lead 28 and the DOWN signal via DOWN lead 30, to generate a discharge path control signal based on the UP and DOWN signals, and to output the discharge path control signal via lead 32. Discharge path control circuit 14 may determine whether both of the UP and DOWN signals are deactivated, and generate the discharge path control signal based on whether both of the UP and DOWN signals are deactivated. For example, discharge path control circuit 14 may activate the discharge path control signal in response to determining that both of the UP and DOWN signals are deactivated, and deactivate the discharge path control signal in response to determining that at least one of the UP and DOWN signals is activated.

In some examples, discharge path control circuit 14 may be implemented with a logic gate where the inputs of the logic gate are coupled to the outputs of PFD 12, respectively, via leads 28, 30, and the output of the logic gate is coupled to a discharge path control input of charge pump 16 via lead 32. In cases where the UP and DOWN signals and the discharge path control signal are active high, discharge path control circuit 14 may be implemented, e.g., with a NOR gate. In cases where the UP and DOWN signals are active low and the discharge path control signal is active high, discharge path control circuit 14 may be implemented, e.g., with a NAND gate.

Charge pump 16 may include a current source and a current sink, and may be configured to receive the UP and DOWN signals via leads 28, 30, and to selectively activate and deactivate the current source and current sink based on the UP and DOWN signals. For example, charge pump 16 may selectively activate and deactivate the current source in charge pump 16 based on the UP signal, and selectively activate and deactivate the current sink in charge pump 16 based on the DOWN signal.

Selectively activating and deactivating the current source in charge pump 16 based on the UP signal may include activating the current source in response to the UP signal being activated, and deactivating the current source in response to the UP signal being deactivated. Selectively activating and deactivating the current sink in charge pump 16 based on the DOWN signal may include activating the current sink in response to the DOWN signal being activated, and deactivating the current sink in response to the DOWN signal being deactivated.

Charge pump 16 may be configured to receive a current amplitude signal from one or more current amplitude control signal sources via leads 40. The current amplitude signal may be indicative of a target current amplitude for the current source and current sink in charge pump 16. Charge pump 16 may program one or more switches in the current source and one or more switches in the current sink based on the current amplitude signal. In some examples, the current amplitude signal may include a plurality of signals where each of the signals indicates whether a respective switch in the current source or sink is closed or open.

The current amplitude control signal sources may be internal to or external to an integrated circuit that implements PLL 10. The signal sources may include active signal sources or passive signal sources (e.g., switches) that allow the current amplitudes produced by the current source and sink in charge pump 16 to be programmed.

Charge pump 16 may output a current via lead 34 that is determined based on the UP and DOWN signals. The polarity of the current may depend on which of the UP and DOWN signals is activated. In response to the UP signal being activated and the DOWN signal being deactivated, charge pump 16 may source current at the output of the charge pump 16. In response to the DOWN signal being activated and the UP signal being deactivated, charge pump 16 may sink current at the output of the charge pump 16. In response to both of the UP and DOWN signals being activated, charge pump 16 may source and sink approximately equal amounts of current at the output of charge pump 16, thereby outputting approximately no current (i.e., no current or a slight amount of current). In response to both of the UP and DOWN signals being deactivated, charge pump 16 may output approximately no current.

Charge pump 16 may be a resistor-based charge pump 16. In a resistor-based charge pump, one or both of the current source and current sink may use sets of one or more resistors to generate the output currents.

According to this disclosure, charge pump 16 may include a high-speed discharge path, and be configured to selectively activate and deactivate the high-speed discharge path based on a discharge path control signal. The high-speed discharge path may, when activated, couple a first node in the current source of charge pump 16 to a second node in the current sink of charge pump 16 via a relatively low resistance path, thereby allowing the first and second nodes to discharge in a relatively quick manner and without significantly affecting the output voltage of loop filter 18.

Charge pump 16 may activate the high-speed discharge path in response to the discharge path control signal being activated (e.g., in response to both of the UP and DOWN signals being deactivated and/or in response to both the current source and current sink of charge pump 16 being deactivated). Charge pump 16 may deactivate the high-speed discharge path in response to the discharge path control signal being deactivated (e.g., in response to at least one of the UP and DOWN signals being activated and/or in response to at least one of the current source and current sink in charge pump 16 being activated).

Loop filter 18 is configured to receive the current generated by charge pump 16 via lead 34, generate a voltage based on the current, and output the voltage via lead 36. In some examples, loop filter 18 may be a low-pass filter, and the voltage at the output of loop filter 18 may be a low-pass filtered version of the current received from charge pump 16. In further examples, loop filter 18 may be an integrator, and the voltage at the output of loop filter 18 may be an integrated version of the current received from charge pump 16.

In some examples, loop filter 18 may be an active filter. In such examples, the active filter may regulate the output of charge pump 16 (e.g., via lead 34) at a reference voltage. In examples where charge pump 16 is a resistor-based charge pump, charge pump 16 may use the regulated output voltage in conjunction with the resistors included in the resistor-based charge pump to generate a current having a target current amplitude.

VCO 20 is configured to receive a voltage via lead 36, generate an oscillating signal based on the received voltage, and output the oscillating signal via lead 38. VCO 20 may generate the oscillating signal such that the frequency of the oscillating signal varies as a function of the received voltage. In some examples, the frequency of the oscillating signal may be a linear function of the received voltage over a target frequency range.

Frequency divider 22 is configured to receive the oscillating signal from VCO 20, generate a frequency-divided version of the oscillating signal, and output the frequency-divided version of the oscillating signal on feedback lead 26. The frequency-divided version of the oscillating signal may be a signal that has a frequency that is equal to the frequency of the oscillating signal divided by an integer or fraction. In some examples, frequency divider 22 may be omitted, and the oscillating signal from VCO 20 may be directly provided to the feedback input of PFD 12.

During operation, when the frequency and phase between the reference and feedback signals are locked, the UP and DOWN signals may generally remain deactivated. In response to the UP and DOWN signals being deactivated, charge pump 16 may deactivate both the current source and current sink of charge pump 16. Also in response to the UP and DOWN signals being deactivated, discharge path control circuit 14 may activate the discharge path control signal, thereby causing charge pump 16 to activate the high-speed discharge path in charge pump 16. The high-speed discharge path in charge pump 16 may rapidly discharge various nodes in the current source and current sink of charge pump 16. Charge pump 16 may output approximately no current (or a small amount of current) to loop filter 18. Loop filter 18 may regulate the output of charge pump 16 at a reference voltage, and maintain the output voltage of loop filter 18 at an approximately constant value. VCO 20 may maintain the frequency of the oscillating signal at an approximately constant value.

If the phase of one of the reference or feedback signals increases relative to the other (or if frequency of either of the reference and feedback signals increases relative to the other), PFD 12 may detect the phase or frequency difference and activate one of the UP and DOWN signals depending on which signal is leading. If the reference signal leads the feedback signal (or the reference signal has a greater frequency than the feedback signal), then PFD 12 may activate the UP signal for a duration of time. In response to the UP signal being activated for a duration of time, charge pump 16 may activate the current source in charge pump 16 for the duration of time. In response to the UP signal being activated, discharge path control circuit 14 may deactivate the discharge path control signal, thereby causing charge pump 16 to deactivate the high-speed discharge path in charge pump 16. The current source in charge pump 16 may source current into loop filter 18 via lead 34. Loop filter 18 receives the source current carried by lead 34, and may charge one or more capacitors in loop filter 18 for the duration of time. The charging of the capacitor may increase the output voltage of loop filter 18. VCO 20 changes the frequency (e.g., increases or decreases the frequency) of the oscillating signal produced by VCO 20 in response to receiving the increased voltage from loop filter 18. Changing the frequency of the oscillating signal may reduce the amount of phase or frequency difference between the reference and feedback signals.

If the feedback signal leads the reference signal (or the feedback signal has a greater frequency than the reference signal), then PFD 12 may activate the DOWN signal for a duration of time. In response to the DOWN signal being activated for a duration of time, charge pump 16 may activate the current sink in charge pump 16 for the duration of time. In response to the DOWN signal being activated, discharge path control circuit 14 may deactivate the discharge path control signal, thereby causing charge pump 16 to deactivate the high-speed discharge path in charge pump 16. The current sink may sink current from loop filter 18 via lead 34. Loop filter 18 receives the sink current carried by lead 34, and may discharge one or more capacitors in loop filter 18 for the duration of time. The discharging of the capacitor may decrease the output voltage of loop filter 18. VCO 20 changes the frequency (e.g., increases or decreases the frequency) of the oscillating signal produced by VCO 20 in response to receiving the decreased voltage from loop filter 18. Changing the frequency may reduce the amount of phase or frequency difference between the reference and feedback signals.

The frequency and/or phase of the output signal may be changed until PLL 10 returns to a phase-locked condition. Upon returning to the phase-lock condition, discharge path control circuit 14 may activate, the discharge path control signal, thereby causing charge pump 16 to activate the high-speed discharge path.

As discussed above, charge pump 16 may include a low-resistance discharge path between respective nodes of a current source and sink in charge pump 16, and charge pump 16 may selectively activate the low-resistance discharge path when charge pump 16 is turned off (e.g., when both the current source and current sink in charge pump 16 are deactivated). The low-resistance discharge path may have a resistance that is lower than the resistance of other current paths between the respective nodes in the charge pump (e.g., current paths formed by the resistors included in the current source and sink of the charge pump), thereby reducing the amount of time needed to reset the charge on the respective nodes when the charge pump is turned off. In this way, the speed of resistor-based charge pump 16 may be increased, thereby allowing the overall speed of active filter-based PLL 10 to be increased.

Figure 2:
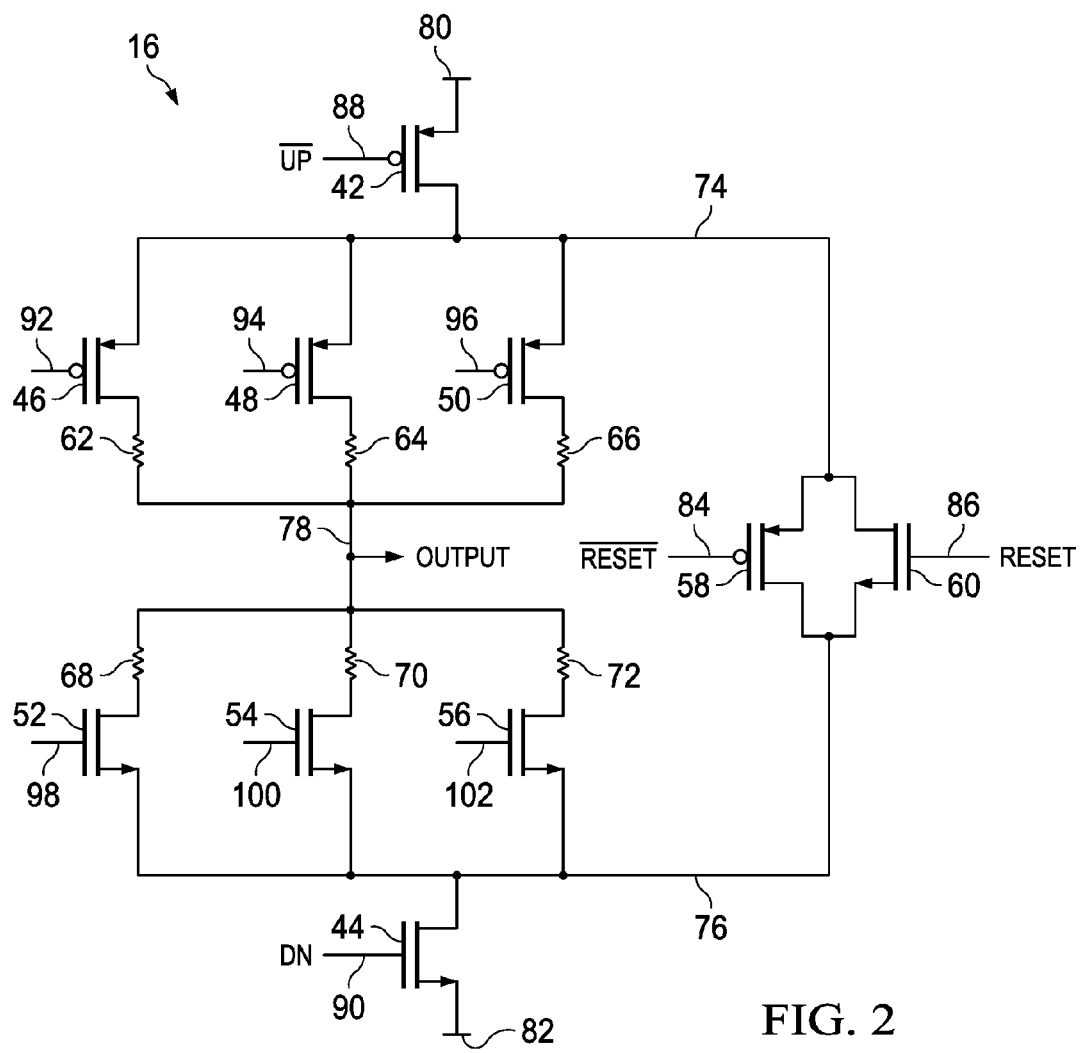
FIG. 2 is a schematic diagram showing an example charge pump having a high-speed discharge path according to this disclosure.

FIG. 2 is a schematic diagram showing an example charge pump 16 according to this disclosure. Charge pump 16 includes transistors 42, 44, 46, 48, 50, 52, 54, 56, 58, 60, resistors 62, 64, 66, 68, 70, 72, nodes 74, 76, 78, a power rail 80, a ground rail 82, and leads 84, 86, 88, 90, 92, 94, 96, 98, 100, 102.

A source electrode of transistor 42 is coupled to power rail 80. A gate electrode of transistor 42 is coupled to lead 88. Lead 88 may be coupled or connected to the UP output of PFD 12 via UP lead 28. In cases where the UP output of PFD 12 is active high, an inverter may be coupled between the UP output of PFD 12 and lead 88. A drain electrode of transistor 42 is coupled to node 74.

Respective source electrodes of transistors 46, 48, 50 are each coupled to node 74. Respective drain electrodes of transistors 46, 48, 50 are each coupled to a first terminal of a respective one of resistors 62, 64, 66. Respective gate electrodes of transistors 46, 48, 50 are coupled to leads 92, 94, 96, respectively. Respective second terminals of resistors 62, 64, 66 are each coupled to output node 78.

A source electrode of transistor 44 is coupled to ground rail 82. A gate electrode of transistor 44 is coupled to lead 90. Lead 90 may be coupled to the DOWN output of PFD 12 via DOWN lead 30. A drain electrode of transistor 44 is coupled to node 76.

Respective source electrodes of transistors 52, 54, 56 are each coupled to node 76. Respective drain electrodes of transistors 52, 54, 56 are each coupled to a first terminal of a respective one of resistors 68, 70, 72. Respective gate electrodes of transistors 52, 54, 56 are coupled to leads 98, 100, 102, respectively. Respective second terminals of resistors 68, 70, 72 are each coupled to output node 78.

A source electrode of transistor 58 is coupled to a drain electrode of transistor 60. The source electrode of transistor 58 and the drain electrode of transistor 60 are coupled to node 74. A drain electrode of transistor 58 is coupled to a source electrode of transistor 60. The drain electrode of transistor 58 and the source electrode of transistor 60 are coupled to node 76. A gate electrode of transistor 58 is coupled to lead 84. A gate electrode of transistor 60 is coupled to lead 86.

Leads 84, 86 may both be coupled to an output of discharge path control circuit 14 via lead 32. In cases where the discharge path control signal is active high, an inverter may be coupled between the output of discharge path control circuit 14 and lead 84.

In the example charge pump 16 of FIG. 2, transistors 42, 46, 48, 50, 58 are p-type metal-oxide-semiconductor (PMOS) transistors, and transistors 44, 52, 54, 56, 60 are n-type MOS (NMOS) transistors. In other examples, any combination of the same or different types of transistors may be used with the same or different conductivity types. Transistors 42, 44, 46, 48, 50, 52, 54, 56, 58, 60 may be examples of switches and/or controlled current sources (e.g., voltage-controlled current sources) where the gate electrodes correspond to the control electrodes, and the source and drain electrodes correspond to current conduction electrodes. In other examples, one or more of transistors 42, 44, 46, 48, 50, 52, 54, 56, 58, 60 may be replaced with combinations of the same or different types of switches and/or controlled current sources (e.g., voltage or current-controlled current sources).

Transistors 42, 46, 48, 50 and resistors 62, 64, 66 may collectively form a source current path between power rail 80 and output node 78. The source current path and power rail 80 may form a current source. The source current path may be a selectively-enabled, programmable amplitude source current path. Similarly, the current source may be a selectively-enabled, programmable amplitude current source.

A first portion of the source current path may be formed by transistor 42, and may be coupled between power rail 80 and node 74. A second portion of the source current path may be formed by one or more of transistors 46, 48, 50 and resistors 62, 64, 66, and may be coupled between node 74 and output node 78. The second portion of the source current path may include a plurality of source current path branches, where each of the source current path branches includes a respective one of transistors 46, 48, 50 coupled in series with a respective one of resistors 62, 64, 66.

Leads 92, 94, 96 may be coupled to a current amplitude signal, and the second portion of the source current path may be programmable based on the current amplitude signal. To program the source current path, charge pump 16 may selectively activate and deactivate various combinations of source current path branches based on the current amplitude signal. Transistors 46, 48, 50 may act as switches, and leads 92, 94, 96 may act as respective control signals for the switches. The current amplitude signal may include a bit (or voltage) for each of the switches that indicate whether the respective switch is to be open or closed. Charge pump 16 may activate a particular combination of current source path branches by turning on a combination of transistors 46, 48, 50 (i.e., closing a set of switches) that correspond to the combination of current source path branches. Charge pump 16 may deactivate a current source path by turning off one of transistors 46, 48, 50 that corresponds to the current source path branch. Resistors 62, 64, 66 may have the same or different resistance values.

By activating and deactivating different combinations of source current path branches, the effective resistance through the source current path may be varied. When output node 78 is regulated at a substantially constant reference voltage (e.g., by loop filter 18 (FIG. 1)), varying the resistance of the source current path may vary the magnitude of current produced by the current source. In this way, the current source may be said to have a programmable amplitude or magnitude.

Transistor 42 may form an activation switch (or enable switch) for the current source. Charge pump 16 may selectively activate the current source based on the UP signal by selectively turning on and off transistor 42 (i.e., closing and opening the switch). When transistor 42 is turned on, current may flow through the source current path between power rail 80 and output node 78. When transistor 42 is turned off, substantially no current may flow between power rail 80 and output node 78. Transistor 42 may allow the current source to be a selectively-enabled current source.

Transistors 44, 52, 54, 56 and resistors 68, 70, 72 may collectively form a sink current path between ground rail 82 and output node 78. The sink current path and ground rail 82 may form a current sink. The sink current path may be a selectively-enabled, programmable amplitude sink current path. Similarly, the current sink may be a selectively-enabled, programmable amplitude current sink.

A first portion of the sink current path may be formed by transistor 44, and may be coupled between ground rail 82 and node 76. A second portion of the sink current path may be formed by one or more of transistors 52, 54, 56 and resistors 68, 70, 72, and may be coupled between node 76 and output node 78. The second portion of the sink current path may include a plurality of sink current path branches, where each of the sink current path branches includes a respective one of transistors 52, 54, 56 coupled in series with a respective one of resistors 68, 70, 72.

Leads 98, 100, 102 may be coupled to a current amplitude signal, and the second portion of the sink current path may be programmable based on the current amplitude signal. To program the sink current path, charge pump 16 may selectively activate and deactivate various combinations of sink current path branches based on the current amplitude signal in a similar fashion to the current source. By activating and deactivating different combinations of sink current path branches, the effective resistance through the sink current path may be varied. When output node 78 is regulated at a substantially constant reference voltage (e.g., by loop filter 18 (FIG. 1)), varying the resistance of the sink current path may vary the magnitude of current produced by the current sink. In this way, the current sink may be said to have a programmable amplitude or magnitude. In some examples, charge pump 16 may program the current source and current sink to source or sink the same amplitude of current.

Transistor 44 may form an activation switch (or enable switch) for the current sink. Charge pump 16 may selectively activate the current sink based on the DOWN signal by selectively turning on and off transistor 44 (i.e., closing and opening the switch). In this way, the current sink may be said to be a selectively-enabled current sink.

Transistors 58, 60 may form a transmission gate, or more generally, a switch that selectively couples node 74 to node 76 based on a discharge path control signal received via leads 84, 86. In response to the discharge path control signal being activated, the transmission gate formed by transistors 58, 60 may close, thereby coupling node 74 to node 76. In response to the discharge path control signal being deactivated, the transmission gate formed by transistors 58, 60 may open, thereby decoupling node 74 from node 76.

Although the example charge pump 16 in FIG. 2 is shown as having three source current path branches and three sink current path branches, greater or fewer numbers of current path branches may be used for both the current source and current sink. In some examples, a single current path branch may be used for both the current source and current sink. In additional examples, the number of source current path branches in the current source may be different than the number of sink current path branches in the current sink.

During operation, output node 78 may be regulated at a substantially constant reference voltage (e.g., by loop filter 18 in FIG. 1). In some examples, the reference voltage may be approximately equal to the average of the voltages supplied by power rail 80 and the ground voltage supplied by ground rail 82.

During operation, charge pump 16 may initially be deactivated (or turned off). Charge pump 16 may be said to be deactivated when both the current source (formed by transistors 42, 46, 48, 50, resistors 62, 64, 66 and power rail 80) is deactivated and the current sink (formed by transistors 44, 52, 54, 56, resistors 62, 64, 66 and ground rail 82) are deactivated. When charge pump 16 is deactivated, the discharge path control signal may be activated (by discharge path control circuit 14 (FIG. 1)), thereby closing the transmission gate formed by transistors 58, 60 and forming a discharge path (or current path) between node 74 and node 76. The voltages at nodes 74, 76, 78 may all be substantially equal to each other and to the reference voltage at which output node 78 is regulated.

Once PFD 12 (FIG. 1) detects a rising edge in either the reference signal or the feedback signal, PFD 12 may activate one of the UP signal or the DOWN signal. If PFD 12 first detects a rising edge in the reference signal, PFD 12 may activate the UP signal. Once the UP signal is activated, charge pump 16 may activate the current source, which may include turning on transistor 42 to activate the source current path between power rail 80 and output node 78. Also if the UP signal is activated, discharge path control circuit 14 (FIG. 1) may deactivate the discharge path control signal, thereby causing charge pump 16 to open the transmission gate formed by transistors 58, 60 and to disconnect (or decouple) node 74 from node 76.

Power rail 80 may charge node 74 (e.g., a parasitic capacitance between node 74 and ground) to a voltage approximately equal (or slightly less) than the voltage at power rail 80. Output node 78 continues to be regulated at the reference voltage. The voltage difference between node 74 and output node 78 causes a current to flow through the activated source current path branches and to loop filter 18 via output node 78. Charge pump 16 may continue to supply current to the loop filter 18 until PFD 12 detects a rising edge in the feedback signal.

In response to detecting a rising edge in the feedback signal, PFD 12 may activate the DOWN signal for a brief period of time to make sure that charge pump 16 is dead-zone free, and then deactivate both the UP and DOWN signals. Once the DOWN signal is activated, charge pump 16 may activate the current sink, which may include turning on transistor 44 to activate the sink current path between node 76 and output node 78. Ground rail 82 may discharge node 76 (e.g., a parasitic capacitance between node 76 and ground) to a voltage approximately equal (or slightly greater) than the voltage at ground rail 82. Output node 78 continues to be regulated at the reference voltage. The voltage difference between node 76 and output node 78 may cause a current to be drawn from loop filter 18 via output node 78 and flow through the activated sink current path. Charge pump 16 may continue to sink current until PFD 12 deactivates the UP and DOWN signals.

In response to PFD 12 deactivating the UP and DOWN signals, discharge path control circuit 14 may activate the discharge path control signal, thereby causing charge pump 16 to close the transmission gate formed by transistors 58, 60 and to connect (or couple) node 74 to node 76. The closed transmission gate may form a low-resistance current path between nodes 74, 76, and nodes 74, 76 may transfer charge between each other via the low-resistance current path such that the resulting voltage at each of nodes 74, 76 is approximately equal to the reference voltage.

The low-resistance discharge path formed by transistors 58, 60 may have a resistance that is lower than the resistance of the current path formed by resistors 62, 64, 66, 68, 70, 72 in the current source and current sink of charge pump 16. The relatively low resistance may allow nodes 74, 76 to return to the regulated voltage in a shorter amount of time than would otherwise occur without the low-resistance discharge path. In this way, the speed of resistor-based charge pump 16 may be increased, thereby allowing the overall speed of an active filter-based PLL 10 to be increased.

Figure 3:
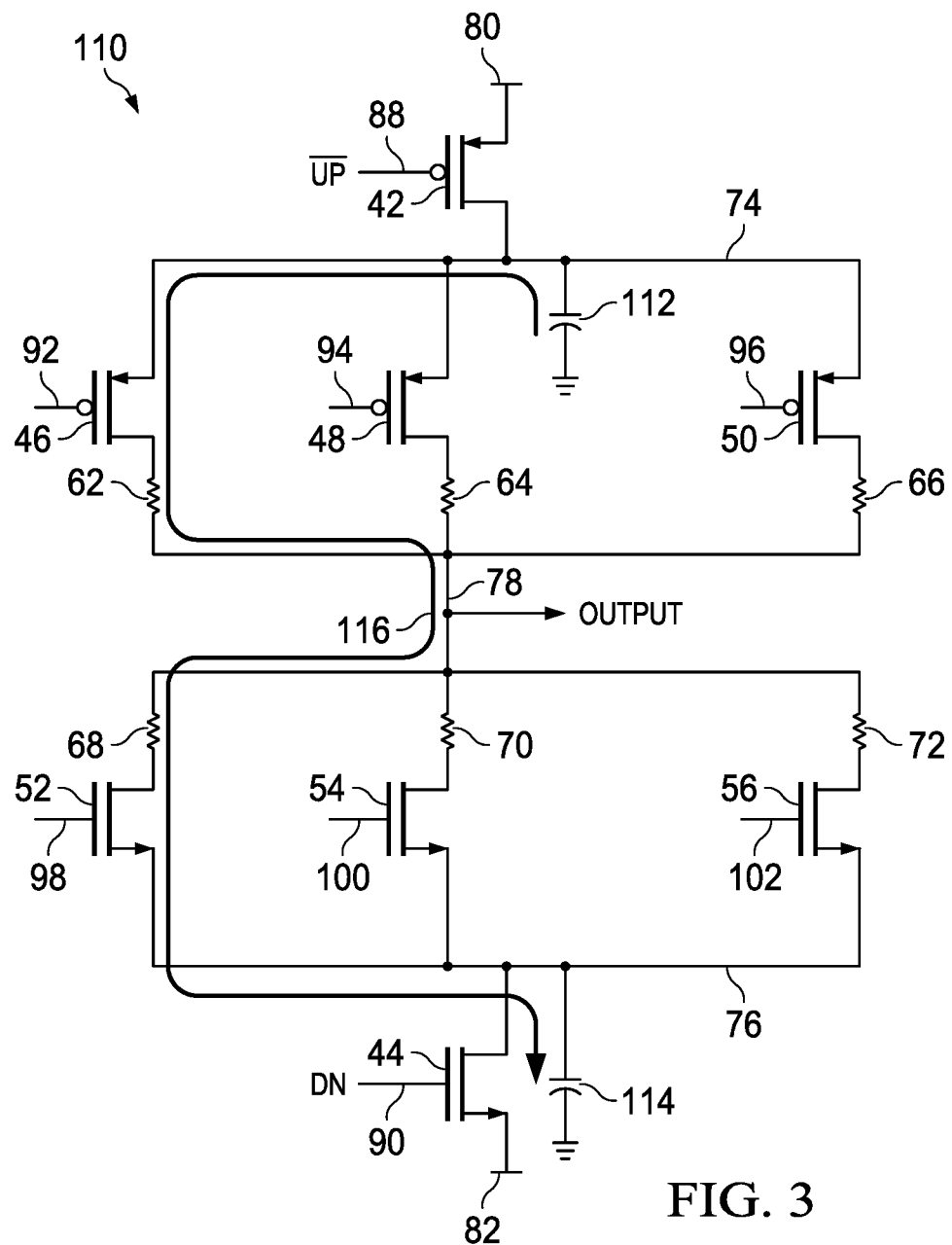
FIG. 3 is a schematic diagram showing an example discharge path for an example charge pump that does not include a high-speed discharge path according to this disclosure.

FIG. 3 is a schematic diagram showing an example charge pump 110 without a high-speed discharge path according to this disclosure. Charge pump 110 includes parasitic capacitances 112, 114 where parasitic capacitance 112 models an effective parasitic capacitance between node 74 and ground, and parasitic capacitance 114 models an effective parasitic capacitance between node 76 and ground. The effective parasitic capacitances may include junction capacitances associated with transistors 42, 44, 46, 48, 50, 52, 54, 56. For example, parasitic capacitance 112 may model the junction capacitances associated with transistors 42, 46, 48, 50 and node 74 (e.g., the gate-drain junction capacitance and the drain-bulk junction capacitance for transistor 42, and the gate-source junction capacitance and the source-bulk junction capacitance for each of transistors 46, 48, 50.

When both the current source and current sink of charge pump 16 are activated, parasitic capacitance 112 may be charged to a voltage approximately equal to the voltage at power rail 80, and parasitic capacitance 114 may be discharged to a voltage approximately equal to the voltage at ground rail 82. When the current source and sink are deactivated, loop filter 18 may continue to regulate output node 78 at a reference voltage. Regulating output node 78 at the reference voltage may cause parasitic capacitance 112 to discharge to the reference voltage, and parasitic capacitance 114 to charge to the reference voltage. This may generate an effective discharge path 116 between parasitic capacitance 112 and parasitic capacitance 114 that passes through the activated branches of the source current path and the sink current path.

The amount of time needed to discharge and charge, respectively, parasitic capacitances 112, 114 to the reference voltage may depend on the amount of parasitic capacitance present and on the resistance values of resistors 62, 64, 66, 68, 70, 72 for the activated current paths. The relatively high parasitic capacitance values and/or resistance values may delay the resetting of the voltages at nodes 74, 76, thereby slowing down the operation of charge pump 16 and consequently PLL 10.

Figure 4:
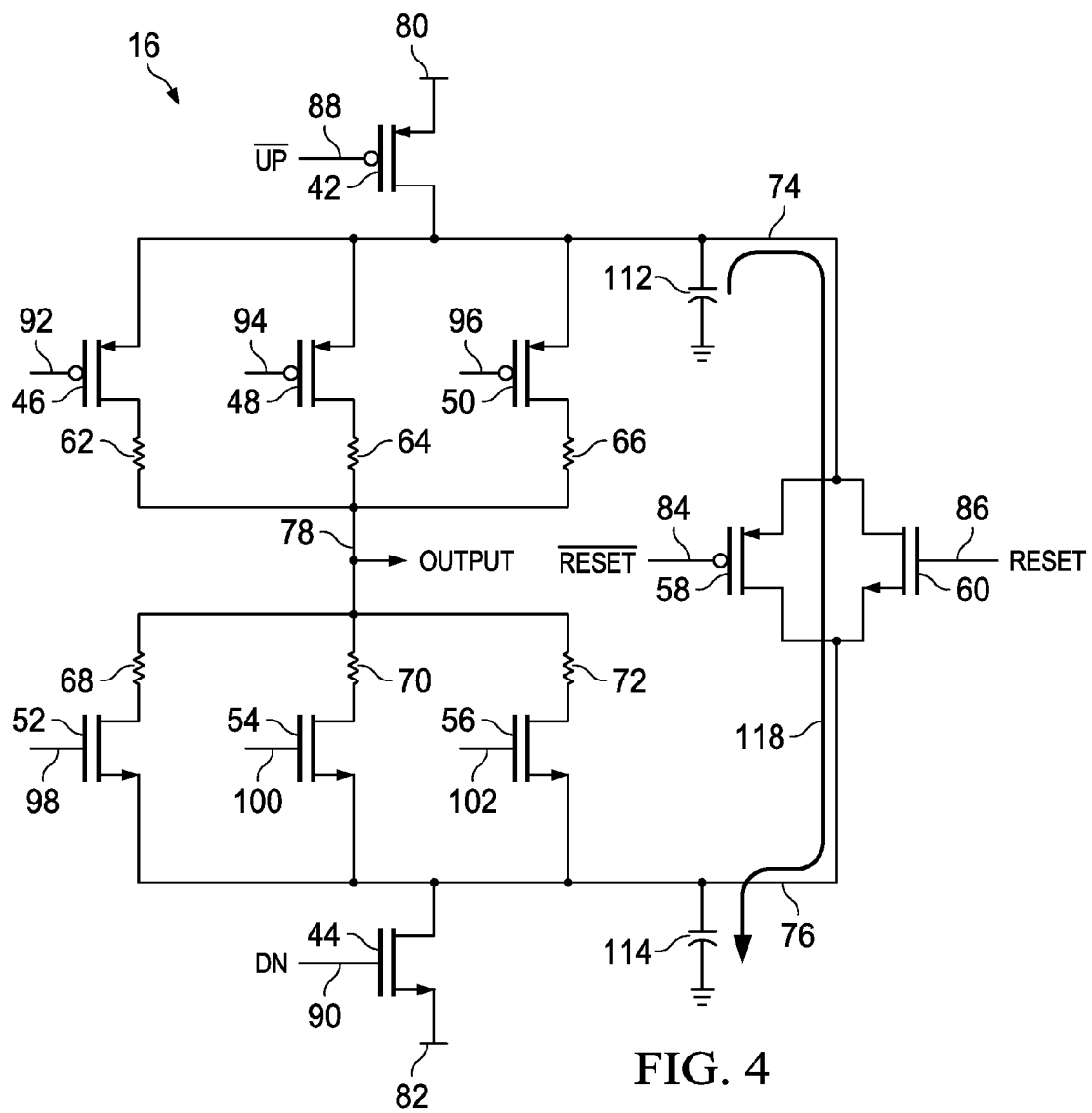
FIG. 4 is a schematic diagram showing an example discharge path for an example charge pump having a high-speed discharge path according to this disclosure.

FIG. 4 is a schematic diagram showing an example discharge path 118 for the example charge pump 16 of FIG. 2 according to this disclosure. Unlike charge pump 110 of FIG. 3, charge pump 16 includes a discharge path that is selectively activated when both the current source and current sink are deactivated. The discharge path may have an effective resistance that is less than an effective resistance of a current path formed between node 74 and node 76 that passes through one or more of resistors 62, 64, 66, one or more of resistors 68, 70, 72, and output node 78. The relatively low resistance of discharge path 118 may allow the first and second nodes to return to the regulated voltage in a shorter amount of time than would otherwise occur without the low-resistance discharge path. In this way, the speed of resistor-based charge pump 16 may be increased, thereby allowing the overall speed of an active filter-based PLL 10 to be increased.

Figure 5:
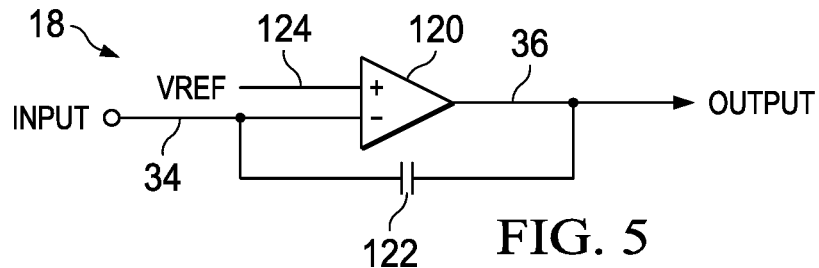
FIG. 5 is a schematic diagram showing an example active filter according to this disclosure.

FIG. 5 is a schematic diagram showing an example active loop filter 18 according to this disclosure. Loop filter 18 includes an operational amplifier 120, a capacitor 122, and leads 34, 36, 124. A non-inverting input of operational amplifier 120 is coupled to a reference voltage via lead 124. Capacitor 122 is coupled between an output of operational amplifier 120 and an inverting input of operational amplifier 120. The inverting input of operational amplifier 120 is coupled to an output of charge pump 16 via lead 34. The output of operational amplifier 120 is coupled to an input of VCO 20 via lead 36.

During operation, loop filter 18 may regulate the voltage at lead 34 (at the output of charge pump 16) at a substantially constant voltage that is approximately equal to the reference voltage (VREF) carried by lead 124. Also during operation, capacitor 122 may charge and discharge based on a current supplied by charge pump 16 to loop filter 18 via lead 34. The charging and discharging of capacitor 122 may increase and decrease the output voltage on lead 36. The loop filter 18 in FIG. 5 is an example of an integrator.

Figure 6:
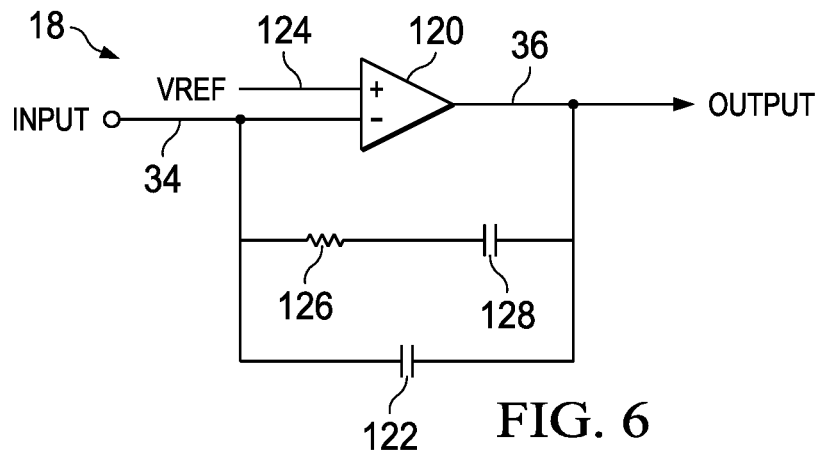
FIG. 6 is a schematic diagram showing another example active filter according to this disclosure.

FIG. 6 is a schematic diagram showing another example active filter 18 according to this disclosure. In addition to the components included in the active filter 18 of FIG. 5, the active filter 18 shown in FIG. 6 includes an additional feedback path. The additional feedback path includes a resistor 126 and a capacitor 128. A first terminal of resistor 126 is coupled to an inverting terminal of operational amplifier 120. A second terminal of resistor 126 is coupled to a first terminal of capacitor 128. A second terminal of capacitor 128 is coupled to the output of operational amplifier 120. The loop filter 18 in FIG. 6 is an example of a low-pass filter.

The example active loop filters 18 shown in FIGS. 5 and 6 are merely examples of active filters that may be used in a PLL 10 according to this disclosure. Other types of active filters, low-pass filters, and integrators may also be used.

Figure 7:
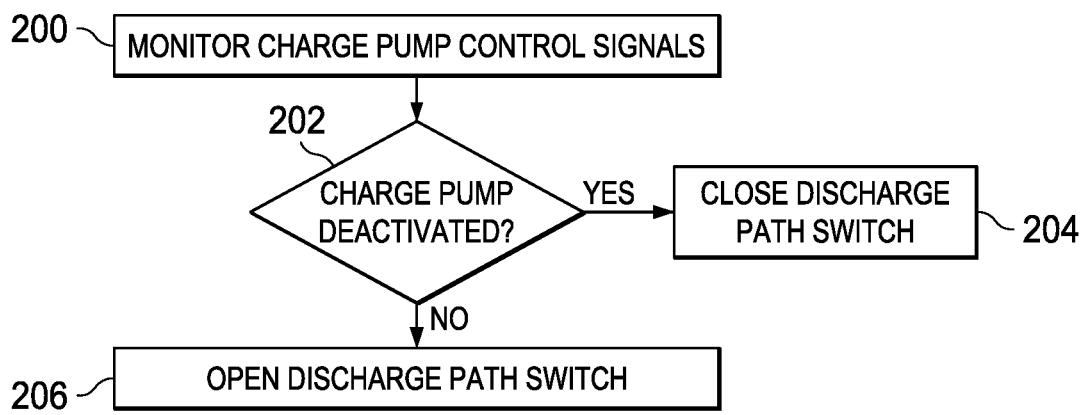
FIG. 7 is a flow diagram illustrating an example technique for increasing the speed of a resistor-based charge pump according to this disclosure.

FIG. 7 is a flow diagram illustrating an example technique for increasing the speed of a resistor-based charge pump according to this disclosure. PLL 10 monitors charge pump control signals (200). For example, the charge pump control signals may include the UP and DOWN signals, and discharge path control circuit 14 may monitor the UP and DOWN signals.

PLL 10 determines whether the charge pump is deactivated (202). For example, discharge path control circuit 14 may generate a control signal (e.g., by using one or more combination logic gates) indicative of whether both the current source and current sink in charge pump 16 are deactivated.

PLL 10 closes a discharge path switch (e.g., the transmission gate formed by transistors 58, 60) in response to both of the outputs of PFD 12 indicating that charge pump 16 is to be deactivated (204). The outputs of PFD 12 may indicate that charge pump 16 is to be deactivated when the outputs of PFD 12 indicate that both the current source and the current sink in charge pump 16 are to be deactivated.

PLL 10 opens the switch (e.g., the transmission gate formed by transistors 58, 60) in response the outputs of PFD 12 indicating that charge pump 16 is to be activated (206). The outputs of PFD 12 may indicate that charge pump 16 is to be activated when the outputs of PFD 12 indicate that at least one of the current source and the current sink in charge pump 16 is to be activated.

The technique shown in FIG. 6 allows PLL 10 to selectively close a switch that connects a first node in a current source of charge pump 16 to a second node in a current sink of charge pump 16 based on whether both outputs of PFD 12 indicate that a charge pump is to be deactivated. In this way, a high-speed, low-resistance discharge path may be selectively activated to increase the speed of the charge transfer when charge pump 16 is deactivated, while avoiding interference with the operation of charge pump 16 when charge pump 16 is activated.

Example embodiments will now be described. In some examples, an integrated circuit includes a phase-frequency detector (PFD) (12) having a first output (U) and a second output (D). The integrated circuit further includes a current source (42, 46, 48, 50, 62, 64, 66, 80) having a control terminal (88) coupled to the first output (U) of the PFD, and an output terminal (78). The integrated circuit includes a current sink (44, 52, 54, 56, 68, 70, 72, 82) having a control terminal (90) coupled to the second output (D) of the PFD, and an output terminal (78) coupled to the output terminal (78) of the current source. The integrated circuit further includes a switch (58, 60) having a first conduction electrode (source of transistor 58 and drain of transistor 60) coupled to a node (74) in the current source, a second conduction electrode (drain of transistor 58 and source of transistor 60) coupled to a node (76) in the current sink, and a control electrode (gates of transistors 58, 60). The integrated circuit further includes a control circuit (14) having a first input coupled to the first output (U) of the PFD, a second input coupled to the second output (D) of the PFD, and an output (32) coupled to the control electrode of the switch.

In some examples, the control circuit (32) is configured to generate a control signal at the output (32) of the control circuit based on a first PFD signal (U) received at the first input of the control circuit and a second PFD signal (D) received at the second input of the control circuit. In such examples, the control circuit (32) may be configured to generate a control signal that causes the switch (58, 60) to close when both the current source and the current sink are deactivated, and that causes the switch to open when at least one of the current source and the current sink is activated.

In further examples, the PFD (12) is configured to generate an UP signal at the first output of the PFD, and a DOWN signal at the second output of the PFD, and the control circuit (14) is configured to generate a control signal based on the UP signal and the DOWN signal. In such examples, the control circuit (14) may be configured to generate a control signal that causes the switch (58, 60) to close in response to the UP and DOWN signals indicating that both the current source and the current sink are to be deactivated. The control signal may further cause the switch (58, 60) to open in response to at least one of the UP signal indicating the current source is to be activated and the DOWN signal indicating that the current sink is to be activated.

In some examples, the current source includes a source current path (42, 46, 48, 50, 62, 64, 66) coupled to the output terminal. The source current path includes a plurality of source current path branches (46, 62; 48, 64; 50, 66) coupled in parallel between a first node (74) of the source current path and the output terminal (78). Each of the source current path branches includes a respective one of a first plurality of resistors (62, 64, 66) coupled in series with a respective one of a first plurality of current source configuration switches (46, 48, 50).

In such examples, the current sink includes a sink current path (44, 52, 54, 56, 68, 70, 72) coupled to the output terminal (78). The sink current path includes a plurality of sink current path branches (52, 68; 54, 70; 56, 72) coupled in parallel between a second node (76) of the sink current path and the output terminal (78). Each of the sink current path branches includes a respective one of a second plurality of resistors (68, 70, 72) coupled in series with a respective one of a second plurality of current sink configuration switches (52, 54, 56).

In additional examples, the integrated circuit includes an active low-pass filter (18) having an input coupled to the output terminals (78) of the current source and the current sink. In such examples, the active low-pass filter (18) may be configured to regulate the voltage at the output terminals of the current source and the current sink at a reference voltage (VREF).

In some examples, an integrated circuit includes a charge pump (16) that includes an output terminal (78). The charge pump further includes a current source (42, 46, 48, 50, 62, 64, 66, 80) including one or more resistors (62, 64, 66) coupled between a first node (74) and the output terminal (78). The charge pump further includes a current sink (44, 52, 54, 56, 68, 70, 72, 82) including one or more resistors (68, 70, 72) coupled between a second node (76) and the output terminal (78). The charge pump further includes a switch (58, 60) including a first terminal (source of transistor 58 and drain of transistor 60) coupled to the first node (74) of the current source and a second terminal (drain of transistor 58 and source of transistor 60) coupled to the second node (76) of the current sink.

In some examples, the on-resistance of the switch is less than a lowest resistance of the resistors in the current source and the resistors in the current sink. In further examples, the effective resistance of a current path formed by the switch between the first and second nodes is less than an effective resistance of a current path between the first and second nodes that passes through one or more of the source resistors (62, 64, 66), one or more of the sink resistors (52, 54, 56), and a node (78) coupled to the output terminal.

In some examples, the switch (58, 60) is a transmission gate. In further examples, the switch, when closed, forms a current path that is free of connection to the output terminal (78) of the charge pump.

In additional examples, the switch includes a control electrode (gates of transistors 58, 60), and the integrated circuit further includes a phase-frequency detector (PFD) (12) having a first output (U) and a second output (D). The integrated circuit further includes a control circuit (14) having a first input coupled to the first output (U) of the PFD, a second input coupled to the second output (D) of the PFD, and an output (32) coupled to the control electrode of the switch.

In further examples, current source includes a first power rail (80), and a first control switch (42) coupled between the first power rail (80) and the first node (74). In such examples, the current sink includes a second power rail (ground rail 82), and a second control switch (44) coupled between the second power rail (82) and the second node (78). A control electrode (88) of the first control switch (42) is coupled to the first output (U) of the PFD (e.g., with an intervening inverter), and a control electrode (90) of the second control switch (44) is coupled to the second output (D) of the PFD.

In some examples, the current source includes a plurality of source current path branches (46, 62; 48, 64; 50, 66) coupled in parallel between the first node (74) of the current source and the output terminal (78). Each of the source current path branches includes a respective one of the resistors (62, 64, 66) in the current source coupled in series with a respective one of a first plurality of current source configuration switches (46, 48, 50).

In such examples, the current sink includes a plurality of sink current path branches (52, 68; 54, 70; 56, 72) coupled in parallel between the second node (76) of the current sink and the output terminal (78). Each of the sink current path branches includes a respective one of the resistors (68, 70, 72) in the current sink coupled in series with a respective one of a second plurality of current sink configuration switches (52, 54, 56).

In some examples, the current source is an adjustable-amplitude current source with a hardware-programmable current amplitude. In such examples, the current sink may be an adjustable-amplitude current sink with a hardware-programmable current amplitude. In further examples, integrated circuit includes an active low-pass filter (18) having a first input coupled to the output terminal (78) of the charge pump, and a second input coupled to a reference voltage lead (124).

This disclosure describes a high-speed resistor-based charge pump for active loop filter-based PLLs with improved leakage performance. The architecture of a resistor-based charge pump without a high-speed, low-resistance discharge path is shown in FIG. 3. This architecture may have a slow discharge path for charge built up on parasitic capacitances when the charge pump is turned OFF. This slow discharge path for leakage current may limit the maximum speed of operation of the charge pump.

One technique for speeding up the charging and discharging of the parasitic capacitors is to couple reduced swing inverters between the activation inputs of the current source and sink and nodes with parasitic capacitances. The reduced swing inverters may be used to discharge or charge the parasitic junction caps to a replica reference voltage. However, for low voltage processes, it may be difficult to obtain acceptable drive on the reduced swing inverters.

According, to this disclosure, a control circuit (14) may generate one or two additional signals from a PFD, and an additional high speed discharge path may be placed in the charge pump. This discharge path may be enabled when the charge pump is turned OFF, thereby discharging the charge built up on parasitic capacitances quickly. The discharge path may be disabled when the charge pump is turned on so as not to interfere with the operation of the charge pump. Selectively activating the discharge path may increase the maximum speed of operation of the charge pump.

Resistor-based charge pumps may have better current matching characteristics than some types of non-resistor based charge pumps. A resistor-based charge pump with programmable resistances (e.g., programmable current path branches) may allow the corner frequency of the control loop and/or the lock acquisition speed to be programmed for a target application. Moreover, a resistor-based charge pump with programmable resistances may allow a PLL to adjust the bandwidth of the PLL and to select a trade-off between the amount of VCO noise allowed by the PLL and the amount of input clock noise allowed by the PLL.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

What is claimed is:

1. An integrated circuit comprising:
   a phase-frequency detector (PFD) having a first output and a second output;
   a current source having a control terminal coupled to the first output of the PFD, and an output terminal;
   a current sink having a control terminal coupled to the second output of the PFD, and an output terminal coupled to the output terminal of the current source;
   a switch having a first conduction electrode coupled to a first node in the current source, a second conduction electrode coupled to a second node in the current sink, and a control electrode; and
   a control circuit having a first input coupled to the first output of the PFD, a second input coupled to the second output of the PFD, and an output coupled to the control electrode of the switch.

2. The integrated circuit of claim 1, wherein the control circuit is configured to generate a control signal at the output of the control circuit based on a first PFD signal received at the first input of the control circuit and a second PFD signal received at the second input of the control circuit.

3. The integrated circuit of claim 1, wherein the control circuit is configured to generate a control signal that causes the switch to close when both the current source and the current sink are deactivated, and that causes the switch to open when at least one of the current source and the current sink is activated.

4. The integrated circuit of claim 1, wherein the PFD is configured to generate an UP signal at the first output of the PFD, and a DOWN signal at the second output of the PFD, and wherein the control circuit is configured to generate a control signal based on the UP signal and the DOWN signal.

5. The integrated circuit of claim 1, wherein the PFD is configured to generate an UP signal at the first output of the PFD, and a DOWN signal at the second output of the PFD, and wherein the control circuit is configured to generate a control signal that causes the switch to close in response to the UP and DOWN signals indicating that both the current source and the current sink are to be deactivated, the control signal further causing the switch to open in response to at least one of the UP signal indicating the current source is to be activated and the DOWN signal indicating that the current sink is to be activated.

6. The integrated circuit of claim 1,
   wherein the current source includes a source current path coupled to the output terminal, the source current path including a plurality of source current path branches coupled in parallel between the first node and the output terminal, each of the source current path branches including a respective one of a first plurality of resistors coupled in series with a respective one of a first plurality of current source configuration switches, and
   wherein the current sink includes a sink current path coupled to the output terminal, the sink current path including a plurality of sink current path branches coupled in parallel between the second node and the output terminal, each of the sink current path branches including a respective one of a second plurality of resistors coupled in series with a respective one of a second plurality of current sink configuration switches.

7. The integrated circuit of claim 1, further comprising: an active filter having an input coupled to the output terminals of the current source and the current sink.

8. The integrated circuit of claim 7, wherein the active filter is configured to regulate a voltage at the output terminals of the current source and the current sink at a reference voltage.

9. An integrated circuit comprising:
   a charge pump including:
      an output terminal;
      a current source including one or more resistors coupled between a first node and the output terminal;
      a current sink including one or more resistors coupled between a second node and the output terminal; and
      a switch including a first terminal coupled to the first node of the current source and a second terminal coupled to the second node of the current sink.

10. The integrated circuit of claim 9, wherein an effective resistance of a current path formed by the switch between the first and second nodes is less than an effective resistance of a current path, between the first and second nodes, that passes through one or more of the resistors in the current source, one or more of the resistors in the current sink, and a node coupled to the output terminal.

11. The integrated circuit of claim 9, wherein the switch is a transmission gate.

12. The integrated circuit of claim 9, wherein the switch, when closed, forms a current path that is free of connection to the output terminal of the charge pump.

13. The integrated circuit of claim 9, wherein the switch includes a control electrode, the integrated circuit further comprising:
   a phase-frequency detector (PFD) having a first output and a second output; and
   a control circuit having a first input coupled to the first output of the PFD, a second input coupled to the second output of the PFD, and an output coupled to the control electrode of the switch.

14. The integrated circuit of claim 9, further comprising:
   a phase-frequency detector (PFD) having a first output and a second output,
   wherein the current source includes a first power rail, and a first control switch coupled between the first power rail and the first node,
   wherein the current sink includes a second power rail, and a second control switch coupled between the second power rail and the second node, and
   wherein a control electrode of the first control switch is coupled to the first output of the PFD, and a control electrode of the second control switch is coupled to the second output of the PFD.

15. The integrated circuit of claim 9,
   wherein the current source includes a plurality of source current path branches coupled in parallel between the first node of the current source and the output terminal, each of the source current path branches including a respective one of the resistors in the current source coupled in series with a respective one of a first plurality of current source configuration switches, and
   wherein the current sink includes a plurality of sink current path branches coupled in parallel between the second node of the current sink and the output terminal, each of the sink current path branches including a respective one of the resistors in the current sink coupled in series with a respective one of a second plurality of current sink configuration switches.

16. The integrated circuit of claim 9,
   wherein the current source is an adjustable-amplitude current source with a hardware-programmable current amplitude, and wherein the current sink is an adjustable-amplitude current sink with a hardware-programmable current amplitude.

17. The integrated circuit of claim 9, further comprising:
an active filter having a first input coupled to the output terminal of the charge pump, and a second input coupled to a reference voltage lead.

18. A method comprising:
selectively closing a switch that connects a first node in a current source of a charge pump to a second node in a current sink of the charge pump based on whether both outputs of a phase-frequency detector (PFD) indicate that a charge pump is to be deactivated.

19. The method of claim 18, wherein selectively closing the switch includes:
closing the switch in response to both of the outputs of the PFD indicating that the charge pump is to be deactivated; and
opening the switch in response to the outputs of the PFD indicating that the charge pump is to be activated.

20. The method of claim 19,
wherein the outputs of the PFD indicate that the charge pump is to be deactivated when the outputs of the PFD indicate that both the current source and the current sink are to be deactivated, and
wherein the outputs of the PFD indicate that the charge pump is to be activated when the outputs of the PFD indicate that at least one of the current source and the current sink is to be activated.

\* \* \* \* \*